United States Patent [19]
Polese

[11] Patent Number: 6,075,428
[45] Date of Patent: Jun. 13, 2000

[54] MAGNETIC SYSTEM FOR AN ELECTROMAGNETIC RELAY

[75] Inventor: Angelo Polese, Berlin, Germany

[73] Assignee: Siemens Electromechanical Components GmbH & Co. KG, Munich, Germany

[21] Appl. No.: 09/307,829

[22] Filed: May 7, 1999

Related U.S. Application Data

[62] Division of application No. 08/896,542, Jul. 18, 1997, Pat. No. 5,888,909.

[30] Foreign Application Priority Data

May 7, 1998 [DE] Germany .......................... 198 20 458

[51] Int. Cl.$^7$ .................................................. H01H 51/22
[52] U.S. Cl. ................................................ 335/78; 335/80
[58] Field of Search .............................. 335/78–86, 124, 335/128, 131, 132, 202; 336/206–8, 192, 198, 182–3

[56] References Cited

U.S. PATENT DOCUMENTS 5,404,123  4/1995  Joseph ..................................... 336/192
5,917,397  6/1999  Sasahara ................................. 336/206

FOREIGN PATENT DOCUMENTS 30 46 947   9/1981  Germany .
197 27 844  8/1997  Germany .

Primary Examiner—Lincoln Donovan
Attorney, Agent, or Firm—Hill & Simpson

[57] ABSTRACT

A magnetic system for an electromagnetic relay including a core having a winding carrier section and at least two pole sections adjoining the winding carrier section and each of the pole sections has a free end. An armature is positioned under the pole sections and forms at least one working air gap with the free ends of the pole sections. Three inner insulation layers surround the core with the exception of the free ends of the pole sections adjacent the armature. At least one of the three inner insulation layers forms a coil body having two coil body flanges. A winding is positioned between the two coil body flanges. A fourth insulation layer surrounds the three inner insulation layers and the winding. A fifth and a sixth insulation layer is arranged such that the winding is surrounded by three insulation layers at a section facing toward the armature.

4 Claims, 2 Drawing Sheets

//6,075,428//

MAGNETIC SYSTEM FOR AN ELECTROMAGNETIC RELAY

This application is a division of Ser. No. 08/896,542 Jul. 18, 1997 U.S. Pat. No. 5,888,909.

BACKGROUND OF THE INVENTION

1. Field of the Invention

The invention is directed to a magnetic system for an electromagnetic relay including a core, an armature, a coil body and an excitation winding.

2. Description of Related Art

German Document No. 196 27 844 C1 teaches an electromagnetic relay having a magnetic system. A first housing part carries a coil and a core that penetrates the coil and forms pole sections outside the coil at both ends of the coil. At least a spring carrier as well as at least one cooperating contact element are anchored in a second housing part. The spring carrier carries a contact spring that interacts with the cooperating contact element. An armature that bridges the pole sections upon formation of working air gaps is connected to the contact spring. The shape of the two housing parts are approximately trough-shaped half-shells of plastic. The edges of the two housing parts are joined in sealing fashion. Further, the terminals for the coil winding and for the contact elements are conducted toward the outside through the wall of their appertaining housing part.

In German Document No. 30 46 947 C2 an electromagnetic, polarized relay whose magnetic circuit (with the exception of the armature) is embedded in a block of insulating material. Before embedding the core into the block, the core is coated with a plastic layer in order to insulate the winding coil from the core. The pole surfaces that form stop faces for the armature are partially covered with plastic layers. The remaining sides of a yoke part are also covered with a plastic layer, whereas the remaining sides of the other yoke part are merely partially covered with plastic layers. The plastic layers extend to the outsides and to the insides of the yoke parts and up to the height of the plastic layers on the pole surfaces. The relay disclosed in German Document No. 30 46 947 C2, however, exhibits a disadvantage in that the insulating measures are relatively involved in terms of production technology. Moreover, a compact relay structure is more difficult to make in view of the comparatively bulky insulating measures.

SUMMARY OF THE INVENTION

The invention is therefore based on the object of realizing a reliable separation of load circuit and excitation circuit of a relay that simultaneously allows the compact relay structure.

This object is achieved by a magnetic system for an electromagnetic relay incorporating principles of the invention. To this end, a magnetic system includes a core having a winding carrier section and at least two pole sections adjoining the winding carrier section and each of the pole sections has a free end. An armature is positioned under the pole sections and forms at least one working air gap with the free ends of the pole sections. Three inner insulation layers surround the core with the exception of the free ends of the pole sections adjacent the armature. At least one of the three inner insulation layers forms a coil body having two coil body flanges. A winding is positioned between the two coil body flanges. A fourth insulation layer surrounds the three inner insulation layers and the winding. A fifth and a sixth insulation layer is arranged such that the winding is surrounded by three insulation layers at a section facing toward the armature.

In an embodiment a magnetic system includes insulation layers that are composed of thermoplastic materials and formed by injection molding.

In an embodiment, the magnetic system includes inner insulation layers that are composed of thermoplastic material and formed by injection molding, whereas the fourth insulation layer is composed of a fiber glass-filled plastic.

In an embodiment, the magnetic system includes insulation layers that have a thickness in the winding region between about 0.1 mm and 0.2 mm.

By contrast to previous solutions, the inventive magnetic system does not require a separate comb or slide, specifically in main relays, that transfers the armature motion onto the contact elements in order to enable the VDE-suited insulation between load circuit and excitation circuit. An especially compact structure is derived due to the fact that at least one of the three inner insulation layers forms a coil body. The thickness of the individual insulation layers in the winding region amounts to between about 0.1 mm and 0.2 mm in order to be able to assure an adequate dielectric strength of the insulation layers. The individual insulation layers are preferably composed of thermal plastic materials and are formed by injection molding. Alternatively thereto, it is possible to form the inner insulation layers of thermal plastic materials, whereas the outer insulation layer is composed of a fiber glass material.

DETAILED DESCRIPTION OF THE DRAWINGS

DETAILED DESCRIPTION OF THE PRESENTLY PREFERRED EMBODIMENTS

Figure 1:
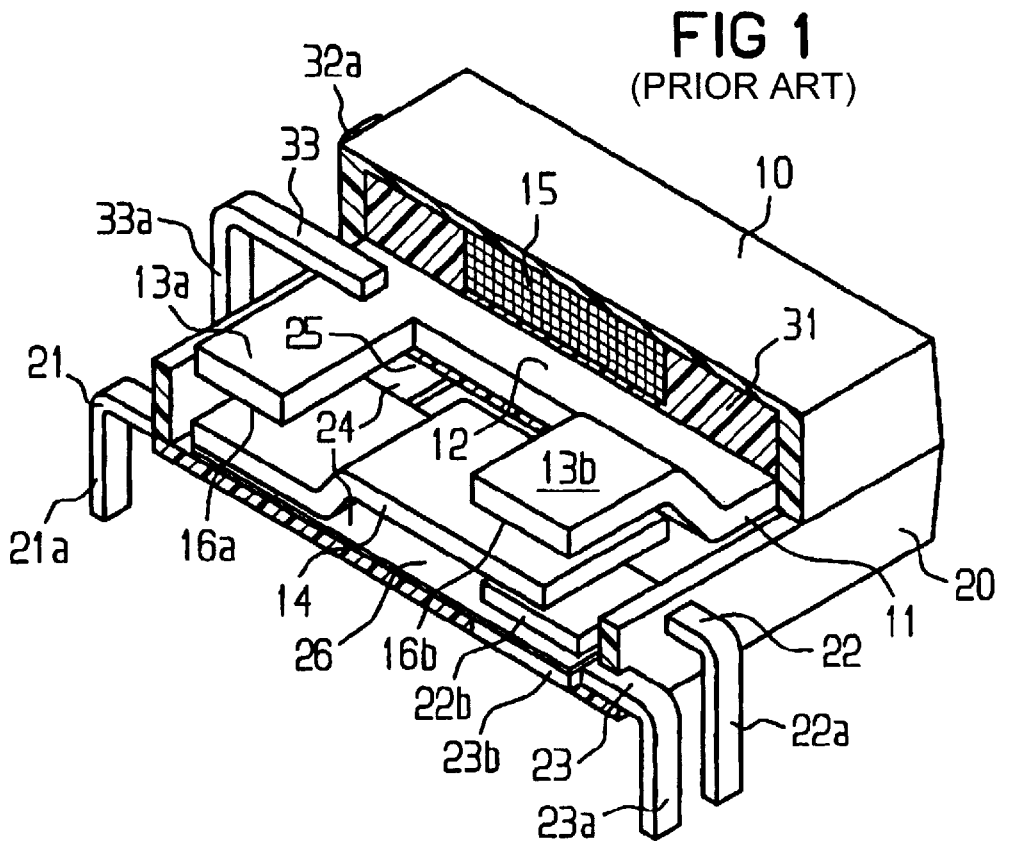
FIG. 1 is a partial cross sectional view of an electromagnetic relay with a traditional magnetic system.
Figure 2:
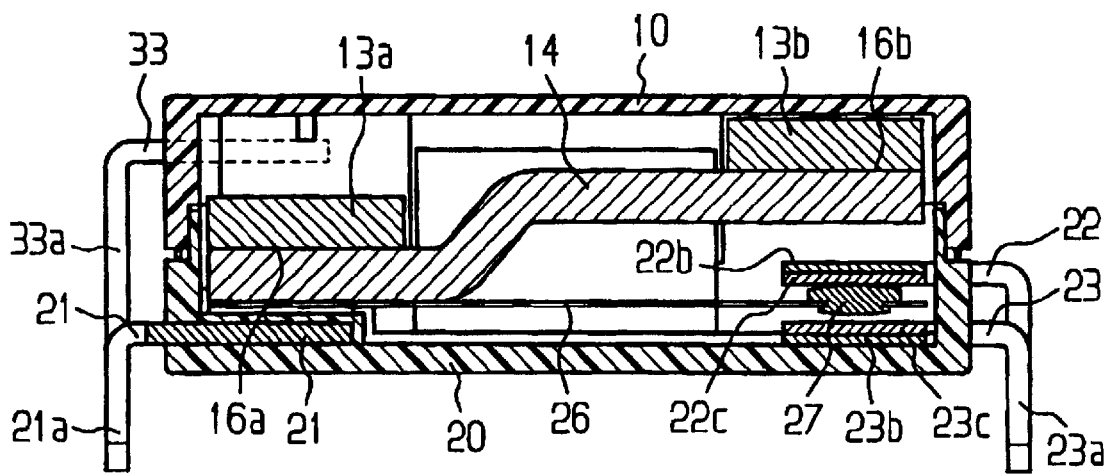
FIG. 2 is a cross sectional view along the coil axis of the relay of FIG. 1, in which the plane of section extends perpendicular to the base plane of the relay.

As an example of a relay having a traditional magnetic system, FIGS. 1 and 2 show an electromagnetic relay disclosed by German Document No. 196 27 844 C1. The structure of the relay is suitable for the employment of an inventive magnetic system. A first housing part 10 carries a coil and a core 11 that penetrates the coil and forms pole sections 13a and 13b outside the coil at both ends thereof. A spring carrier 21 as well as two cooperating contact elements 22 and 23 are anchored in a second housing part 20. The spring carrier 21 carries a contact spring 24 that interacts with the cooperating contact elements 22 and 23. An armature 14 bridges the pole sections 13a and 13b upon formation of working air gaps and is connected to the contact spring 24. The two housing parts 10 and 20 shaped approximately as trough-shaped half-shells of plastic, have their edges joined in a sealing fashion. Further, the terminals 21a, 22a, 23a, 32a and 33a for the excitation winding 15 and for the contact elements 21, 22 and 23 are conducted toward the outside through the wall of the appertaining housing part 10 or 20.

The first half-shell 10 is formed by extrusion coating of the coil. The second half-shell 20 is formed by extrusion coating of the spring carrier 21 of the cooperating contact elements 22 and 23. The contact spring 24 secured to the spring carrier 21 is L-shaped and has a first spring leg 25 that extends at the end face in front of the coil and also has a second spring leg 26 that extends laterally next to the coil under the armature 14 and carries a movable contact 27. The ends of the crimped armature 14 respectively form working air gaps with two pole faces 16a and 16b of the pole sections 13a and 13b, which are part of a U-shaped core 11. However, the pole section 13b is crimped upward out of the core plane.

The coil is produced first in the manufacturing process. The winding carrier 12 of the core 11 is extrusion coated with thermal plastic material. As a result, a coil body 31 is formed. The pole sections 13a and 13b are thereby kept free. Moreover, two coil terminal elements 32 and 33 are injected into the coil body 31. To this end, not only the outwardly directed terminal pins 32a and 33a remain free of the embedding but also the inner connecting surfaces intended for contacting the winding ends. After this, the excitation winding 15 is applied between the coil body flanges, being applied onto the coil body 31.

Subsequently, the entire coil is again extrusion coated in order to acquire the first half-shell 10. The pole surfaces 16a and 16b of the pole sections 13a and 13b also remain free of this extrusion-coating, whereas the other parts, particularly the coil winding 15, are embedded into the plastic of the first half-shell 10. The coil terminal pins 32a and 33a are conducted tightly toward the outside in this renewed embedding, where they are angled off downwardly as shown in FIG. 1. A cavity for the coil and for the movable armature contact spring unit is kept free in the extrusion-coating of the spring carrier 21 as well as the cooperating contact elements 22 and 23. The cooperating contact elements 22 and 23 have terminal pins 22a and 23a, respectively, conducted tightly toward the outside. In addition, a fixed contact section 22b or 23b, respectively, in the inside is provided with a precious metal contact layer 22c or 23c.

Figure 3:
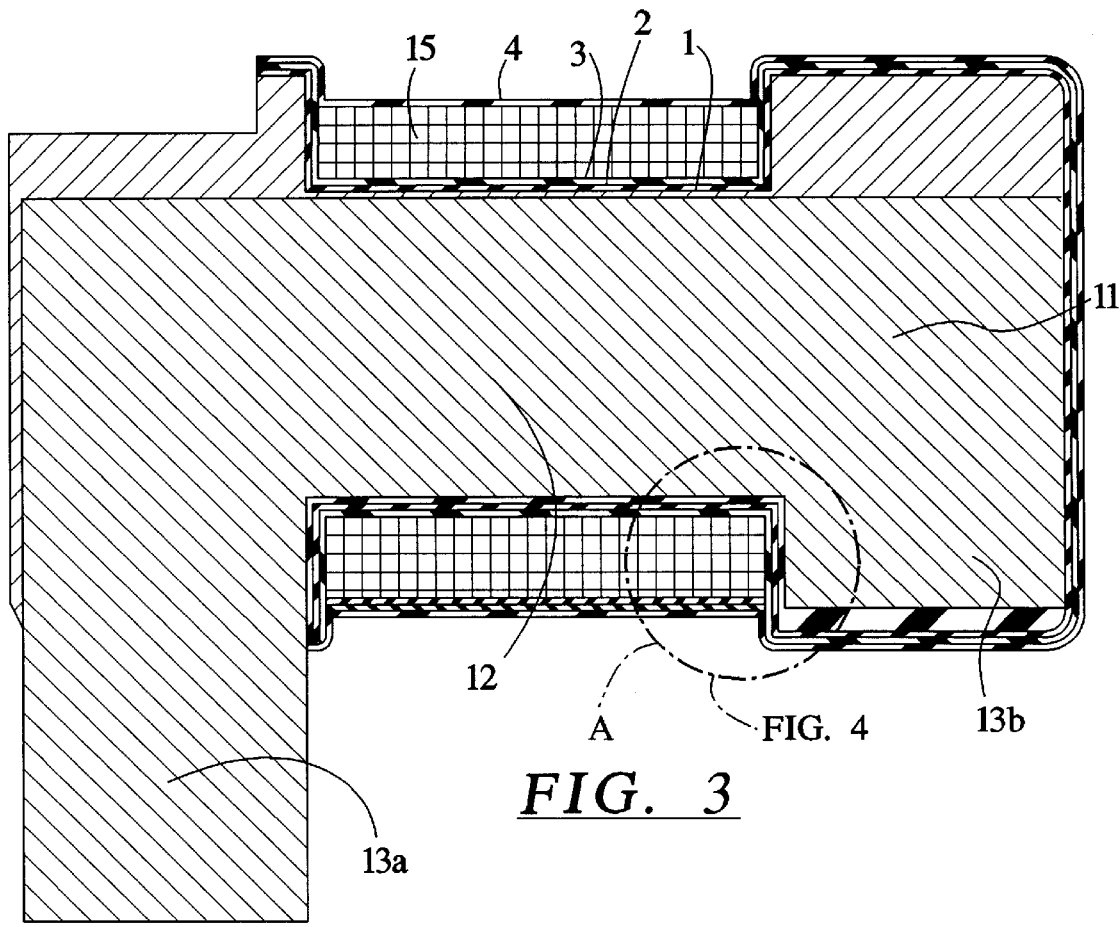
FIG. 3 is a cross sectional view of a magnetic system (without an armature) that is suitable for the relay of FIGS. 1 and 2.

FIG. 3 shows the cross-section of an inventive magnetic system without an armature, this being suited, for example, for the relay according to FIGS. 1 and 2 and enabling a VDE-suited separation of excitation and load circuit. The magnetic circuit includes a core 11 having two pole sections 13a and 13b adjoining at a winding carrier section 12 of the core 11. As in the magnetic system of the relay of FIGS. 1 and 2, a first pole section 13a is planar, whereas the second pole section 13b is upwardly crimped. The crimped part of the second pole section 13b is not shown in the sectional view of FIG. 3. An excitation winding 15 is arranged between the coil body flanges.

Figure 4:
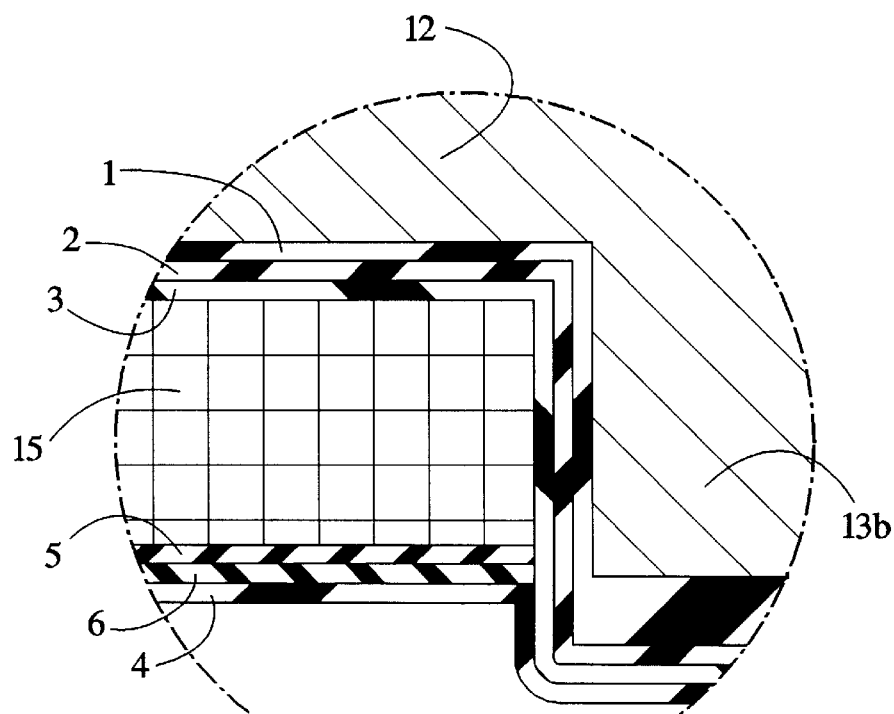
FIG. 4 is an enlarged view of section A of FIG. 3.

An additional, fourth insulation layer 4 surrounds the excitation winding 15 as well as the third insulation layer 3 and represents an outer insulation layer. An especially high mechanical loadability derives where the outer insulation layer 4 is composed of a fiber glass-filled plastic. Like the other insulation layers, however, it can also be composed of a thermal plastic material and can be formed by injection molding. A fifth insulation layer 5 and a sixth insulation layer 6 are arranged between the excitation winding 15 and the outer insulation layer 4 at a section facing toward the armature 14. Alternatively thereto, it would be possible to apply the fifth insulation layer 5 and the sixth insulation layer 6 onto the fourth insulation layer 4. In any case, both the core 11 and the armature are separated from the excitation winding 15 by a three-component insulation layer (also see FIG. 4). A minimum thickness of the individual insulation layers of approximately 0.1 mm assures an adequate dielectric strength of the individual insulation layers. As such, the employment of a slide or an actuator can be foregone as a result of the inventive arrangement, specifically given means relays.

It should be understood that various changes and modifications to the presently preferred embodiments described herein will be apparent to those skilled in the art. Such changes and modifications may be made without departing from the spirit and scope of the present invention and without diminishing its attendent advantages. It is, therefore, intended that such changes and modifications be covered by the appended claims.

What is claimed is:

1. A magnetic system for an electromagnetic relay, comprising:

a core having a winding carrier section and at least two pole sections adjoining the winding carrier section, each of the at least two pole sections having a free end;

an armature bridges said at least two pole sections, said armature forming at least one working air gap with the free ends of the at least two pole sections;

three inner insulation layers surround the core between the at least two pole sections adjacent the armature, at least one of the three inner insulation layers forms a coil body having two coil body flanges;

a winding being positioned between the two coil body flanges;

a fourth insulation layer surrounds the three inner insulation layers and the winding; and a fifth and a sixth insulation layer arranged such that the winding is surrounded by three insulation layers at a section facing toward the armature.

2. The magnetic system of claim 1, wherein the insulation layers are composed of thermal plastic material and formed by injection molding.

3. The magnetic system of claim 1, wherein the inner insulation layers are composed of thermal plastic material and formed by injection molding, whereas the fourth insulation layer is composed of a fiberglass-filled plastic.

4. The magnetic system of claim 1, wherein the thickness of the insulation layers in the winding region is between about 0.1 mm and 0.2 mm.

* * * * *